United States Patent
Totani et al.

(10) Patent No.: US 7,417,195 B2
(45) Date of Patent: Aug. 26, 2008

(54) CIRCUIT BOARD AND CIRCUIT BOARD CONNECTION STRUCTURE

(75) Inventors: Makoto Totani, Kariya (JP); Toshihiro Miyake, Inuyama (JP); Fumio Kojima, Chiryu (JP)

(73) Assignee: DENSO Corporation, Kariya (JP)

( * ) Notice: Subject to any disclaimer, the term of this patent is extended or adjusted under 35 U.S.C. 154(b) by 660 days.

(21) Appl. No.: 10/769,763

(22) Filed: Feb. 3, 2004

(65) Prior Publication Data

US 2004/0156583 A1 Aug. 12, 2004

Related U.S. Application Data

(63) Continuation of application No. PCT/JP03/09963, filed on May 8, 2003.

(30) Foreign Application Priority Data

Aug. 7, 2002 (JP) ............... 2002-230351

(51) Int. Cl.
*H05K 1/03* (2006.01)
(52) U.S. Cl. ............ 174/255; 174/254; 174/262
(58) Field of Classification Search ........... 174/261, 174/262, 260, 255, 254; 361/792, 793, 794, 361/795; 439/65, 67
See application file for complete search history.

(56) References Cited

U.S. PATENT DOCUMENTS

| | | | | |
|---|---|---|---|---|
| 5,165,984 A | 11/1992 | Schoenthaler | ............... | 428/209 |
| 5,281,151 A * | 1/1994 | Arima et al. | ............... | 439/68 |
| 5,428,190 A | 6/1995 | Stopperan | ............... | 174/261 |
| 5,914,358 A | 6/1999 | Kawakita et al. | ............... | 523/458 |
| 6,329,610 B1 * | 12/2001 | Takubo et al. | ............... | 174/264 |
| 6,449,836 B1 | 9/2002 | Miyake et al. | | |
| 6,593,534 B2 | 7/2003 | Jones et al. | ............... | 174/262 |
| 6,812,412 B2 * | 11/2004 | Obata et al. | ............... | 174/261 |
| 6,831,236 B2 | 12/2004 | Higuchi et al. | ............... | 174/264 |

FOREIGN PATENT DOCUMENTS

| | | |
|---|---|---|
| JP | A-04-177864 | 6/1992 |
| JP | A-06-6006 | 1/1994 |
| JP | A-09-506206 | 6/1997 |
| JP | A-2000-312061 | 11/2000 |
| JP | A-2001-085840 | 3/2001 |

* cited by examiner

*Primary Examiner*—Ishwar I. B. Patel
(74) *Attorney, Agent, or Firm*—Posz Law Group, PLC

(57) ABSTRACT

A printed circuit board 2 and an FPC board 3 to be connected together are each given a multilayer structure wherein insulating films 23, 33 and interconnection patterns 22, 32 are stacked alternately. In the FPC board 3, connecting signal lines are distributed among the multilayered interconnection patterns 22, and in the printed circuit board 2, interconnecting to lands 32*a* formed on a connection face thereof is carried out using interconnection patterns 32 of inner layers. By this means, it is possible to greatly increase the number of connecting signal lines between the printed circuit board 2 and the FPC board 3.

17 Claims, 6 Drawing Sheets

CIRCUIT BOARD AND CIRCUIT BOARD CONNECTION STRUCTURE

CROSS REFERENCE TO RELATED APPLICATION

This application is a continuation of an international patent application No. PCT/JP03/09963 filed May 8, 2003, designating the United States of America, the contents of which are incorporated herein by reference.

TECHNICAL FIELD

The present invention relates to a circuit board having a stack structure made up of a plurality of board parts, and to a connection structure for connecting a plurality of circuit board parts.

BACKGROUND ART

In related art, as a connection structure for connecting a flexible printed circuit board (FPC board) made of a thermoplastic resin to a mother board, for example the connection structure disclosed in JP-A-2001-111209 is known. This connection structure is obtained in the following way.

That is, as shown in FIG. 11, respective connection terminal parts (lands) 113a, 111a of interconnection patterns 113 formed on an FPC board 105 and interconnection patterns 111 formed on a mother board 102 are brought together with solder paste 120a, 120b therebetween. Then, by means of a thermocompression tool 121, connecting areas of the boards 102, 105 are heated to above the glass transition point of the thermoplastic resin constituting the insulating layer 112 of the FPC board 105, and also a pressure is applied to them. As a result, the FPC board 105 and the mother board 102 are connected by the respective interconnection patterns 111, 113 being electrically connected by the solder and the thermoplastic resin constituting the insulating layer 112 of the FPC board 105 softening and becoming intimate with the insulating layer 110 of the mother board 102.

In the connection structure described above, the number of signal lines connected between the two boards is limited by the width of the FPC board 105 and the spacing of the interconnection patterns 113 including the lands 113a. Because of this, to increase the number of connecting signal lines it is necessary either to increase the width of the FPC board 105 or to make the spacing of the interconnection patterns 113 including the lands 113a as narrow as possible.

However, because of a requirement for small size and light weight, it is not possible to freely increase the width of the FPC board 105. And also with regard to narrowing the spacing of the interconnection patterns 113 including the lands 113a, because of problems such as migration and short-circuiting, and problems of etching precision at the time of formation of the interconnection patterns 113, it is not possible to greatly increase the number of connecting signal lines.

The present invention was made in view of these problems with related art, and an object of the invention is to provide a circuit board and a circuit board connection structure with which it is possible to greatly increase the number of connecting signal lines without increasing the width of the board parts being connected.

DISCLOSURE OF THE INVENTION

To achieve the above-mentioned object, a circuit board according to a first aspect of the invention comprises a flat plate shaped first board part and a flat plate shaped second board part disposed stacked on a partial region of this first board part. The first board part and the second board part each comprise a substrate formed in a flat plate shape, a plurality of interconnection patterns arranged inside the substrate so as to form a plurality of layers in its thickness direction, and multiple interlayer connection parts disposed inside the substrate for connecting interconnection patterns belonging to different layers.

At least one of the substrate of the first board part and the substrate of the second board part is made of a thermoplastic resin, and the first board part and the second board part are joined at their stacked regions by the thermoplastic resin being melted and then rehardened.

A plurality of first interconnection patterns are disposed on the stacked region of the first board part, a plurality of second interconnection patterns are disposed on the stacked region of the second board part so as to form pairs with the plurality of first interconnection patterns, and between the pairs of the first interconnection patterns and the second interconnection patterns, interboard connection parts are formed by a connection material which melts at least partially at a temperature applied to melt the thermoplastic resin and electrically connects the first and second interconnection patterns together.

Thus, a circuit board according to the first aspect of the invention has a first board part and second board part each formed with multiple layers of interconnection patterns, and the two board parts in the stacked regions have multiple first interconnection patterns and second interconnection patterns respectively. As a result, in the stacked regions of the two board parts, interconnection patterns of inner layers of the respective board parts can be used to provide connecting signal lines, and consequently it is possible to greatly increase the number of connecting signal lines without increasing the width of the board parts.

A second aspect of the invention relates to a circuit board connection structure for connecting a first circuit board in which a thermoplastic resin is used as an insulating material to a second circuit board serving as a mother board. In this circuit board connection structure, the first circuit board has a multilayer structure wherein insulating layers made from a thermoplastic resin and interconnection layers are stacked alternately and to electrically connect adjacent interconnection layers together an interlayer connection material is disposed in the insulating layers, and the second circuit board also has a multilayer structure wherein insulating layers and interconnection layers are stacked alternately and an interlayer connection material for electrically connecting adjacent interconnection layers together is disposed in the insulating layers.

In an insulating layer constituting a connection face of the first circuit board to be connected to the second circuit board, via holes reaching the inner interconnection layer are formed, and these via holes are filled with a connection material; at least lands to serve as connection terminals are formed on a connection face of the second circuit board, and inner interconnection layers are used for interconnecting to those lands. The first circuit board is connected to the second circuit board by the connection material of the first circuit board being electrically connected to the lands of the second circuit board and the insulating layer constituting the connection face of the first circuit board being adhered to the connection face of the second circuit board by thermal welding.

By the connected first circuit board and second circuit board each being made a multilayer structure wherein insulating layers and interconnection layers are stacked alternately as described above, it is possible for the number of connecting signal lines between the two boards to be greatly increased. That is, in the first circuit board, by connecting signal lines being distributed among the interconnection layers provided in numerous layers, with respect to an FPC board having only one interconnection layer as in related art, the number of connecting signal lines can be dramatically increased. And in the second circuit board also, by interconnecting to the lands formed on the connection face of the second circuit board using inner interconnection layers, it is possible to increase the number of lands that can be formed on the connection face and consequently it is possible to form a number of lands corresponding to the number of connecting signal lines of the first circuit board.

A third aspect of the invention also relates to a circuit board connection structure for connecting a first circuit board in which a thermoplastic resin is used as an insulating material to a second circuit board serving as a mother board. In this circuit board connection structure, the first circuit board has a multilayer structure wherein insulating layers made from a thermoplastic resin and interconnection layers are stacked alternately and to electrically connect adjacent interconnection layers together interlayer connection material parts are disposed in the insulating layers, and the second circuit board also has a multilayer structure wherein insulating layers and interconnection layers are stacked alternately and interlayer connection material parts for electrically connecting adjacent interconnection layers together are disposed in the insulating layers.

Also, on an insulating layer surface constituting a connection face of the first circuit board to be connected to the second circuit board, at least first lands are formed as connection terminals, and the inner interconnection layers are used for interconnecting to the first lands, and second lands to serve as connection terminals forming pairs with the first lands are formed on the connection face of the second circuit board and inner interconnection layers are used for interconnecting to the second lands. A land connection material is formed on at least one of the first lands and the second lands, and the first circuit board is connected to the second circuit board by the two lands being electrically connected by this land connection material and the insulating layer constituting the connection face of the first circuit board being adhered to the connection face of the second circuit board by thermal welding.

Thus, in a circuit board connection structure according to the third aspect of the invention, differently from a connection structure according to the second aspect described above, first and second lands to constitute connection terminals are formed on the connection faces of first and second circuit boards having multilayer structures. And these first and second lands are electrically connected by a land connection material. With this kind of construction also, it is possible to connect interconnection layers of first and second circuit boards at multiple locations. Accordingly, it is possible to provide numerous connecting signal lines without widening the width of the first circuit board.

BEST MODES FOR CARRYING OUT THE INVENTION

First Embodiment

A first embodiment of the present invention will now be described on the basis of the accompanying drawings.

Figure 1:
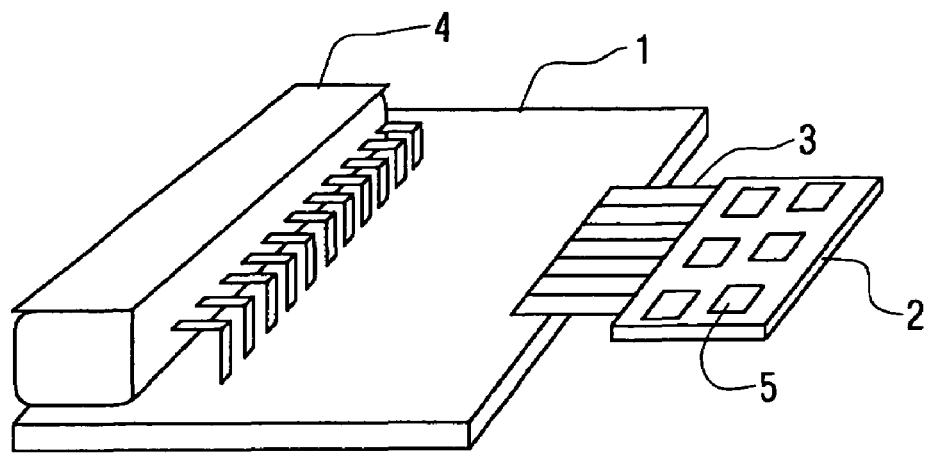
FIG. 1 is a perspective view showing the construction of an electronic device to which a connection structure according to an embodiment of the invention has been applied.

FIG. 1 shows the internal construction of an electronic device to which a printed circuit board connection structure according to this first embodiment has been applied. Inside this electronic device, a printed circuit board 1 constituting a first mother board and a printed circuit board 2 constituting a second mother board are connected by a flexible printed circuit board (FPC board) 3. On the printed circuit board 1 are mounted various electronic components (not shown) and a connector 4 for connecting it to an external device. On the printed circuit board 2 are densely mounted various package devices 5. By means of this construction, for example if a common control function part of the electronic device is concentrated on the printed circuit board 2 and function parts differing according to the product type are concentrated on the printed circuit board 1, because the printed circuit board 2 can be used commonly, there is an effect of reducing design labor and product cost.

And because with a printed circuit board 2 on which various package devices 5 are mounted to a high density as shown in FIG. 1 its size can be made small, a contribution can also be made to reducing the overall size of the electronic device. However, the width of an FPC board 3 to be connected to a printed circuit board 2 made small like this is limited by the size of the printed circuit board 2. And the need arises for numerous connecting signal lines connected to the densely mounted package devices 5 to be formed within this limited width.

Figure 2:
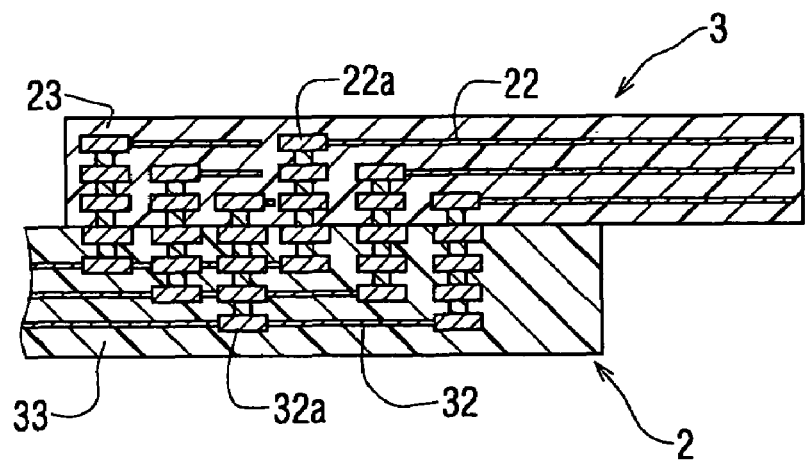
FIG. 2 is a sectional view showing connecting parts of a printed circuit board 2 and an FPC board 3.

To this end, in this embodiment, as shown in FIG. 2, the printed circuit board 2 and the FPC board 3 are each given a multilayer structure in which insulating resin films 23, 33 and interconnection patterns 22, 32 are stacked alternately, and the two boards 2, 3 are connected. Because the connection between the printed circuit board 1 and the FPC board 3 is also effected in the same way as the connection between the printed circuit board 2 and the FPC board 3, in the following just the connection structure of the printed circuit board 2 and the FPC board 3 will be described.

By the printed circuit board 2 and the FPC board 3 each being made a multilayer structure and the two boards 2, 3 being connected as mentioned above, the number of connecting signal lines can be greatly increased. That is, in the FPC board 3, by the connecting signal lines being distributed among interconnection patterns 22 provided in multiple layers, as shown in FIG. 2, with respect to an FPC board having only one layer of interconnection patterns as in related art, the number of connecting signal lines can be dramatically increased. And also in the printed circuit board 2, by wiring to lands 32*a* serving as connection terminals formed on its connection face using interconnection patterns 32 of inner layers, the number of lands 32*a* which can be formed on that connection face can be increased. Consequently, a number of lands 32*a* corresponding to the number of connecting signal lines increased by the use of multiple layers in the FPC board 3 can be formed.

It is to be noted that the printed circuit board 2 and the FPC board 3 are connected with parts of each made to overlap each other, and in this overlap region a circuit board is formed with the printed circuit board 2 as a first board part and the FPC board 3 as a second board part and the two board parts stacked.

Next, a method for manufacturing the FPC board 3 will be described, using FIGS. 3(*a*) through (*e*). Because the printed circuit board 2 can be manufactured in the same way as the FPC board 3 with the same or a different thermoplastic resin as the insulating material, a description of a method for manufacturing the printed circuit board 2 will be omitted. And alternatively the printed circuit board 2 maybe manufactured by the known build-up method or blind via hole (BVH) method, using a thermosetting resin, for example a glass fabric base material epoxy resin, as the insulating material.

Figure 3:
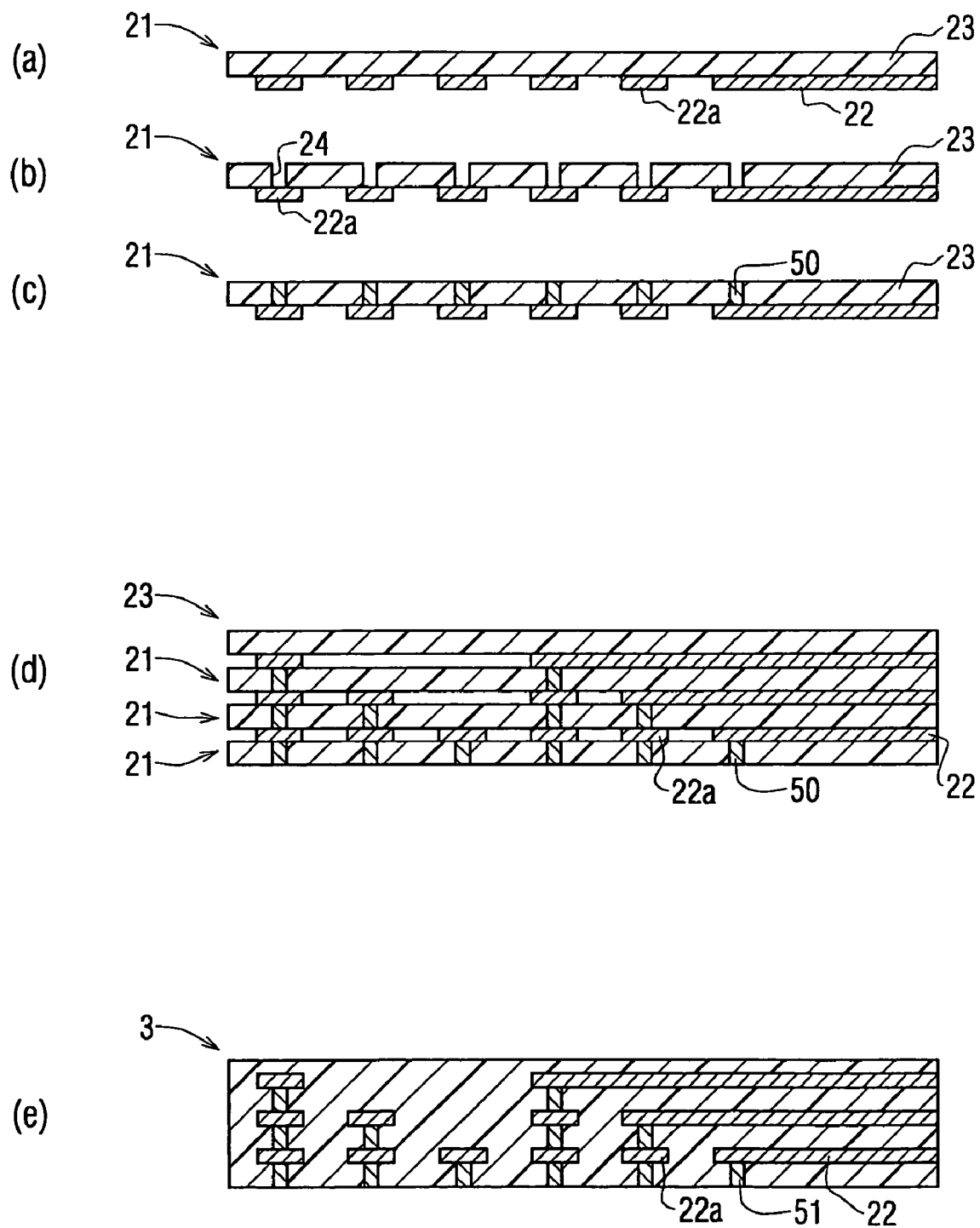
FIGS. 3(a) through 3(e) are step by step sectional views illustrating a manufacturing process of the FPC board 3.

In FIG. 3(*a*), 21 is a one-side pattern film having an interconnection pattern 22 including lands 22*a* formed by patterning by etching a conducting foil (in this example, a copper foil of thickness 18 µm) affixed to one side of a resin film 23 which has the shape of a flat plate and is an insulating material. In this example, a thermoplastic resin film of thickness 75 µm consisting of polyether-ether-ketone resin 65 to 35 wt % and polyether-imido resin 35 to 65 wt % is used as the resin film 23. The conducting foil is welded to this resin film 23 by heating, without using an adhesive.

When the formation of the interconnection pattern 22 including the lands 22*a* is completed, as shown in FIG. 3(*a*), next, as shown in FIG. 3(*b*), a carbon dioxide gas laser is irradiated from the resin film 23 side to form via holes 24, which are bottomed via holes each having a land 22*a* or an interconnection pattern 22 as its bottom face. In the formation of the via holes 24, the output and irradiation time of the carbon dioxide gas laser are adjusted so that no holes are made in the interconnection patterns 22. The diameter of the via holes 24 is 50 to 100 µm.

As shown in FIG. 3(*b*), when the formation of the via holes 24 is completed, next, as shown in FIG. 3(*c*), the via holes 24 are filled with a conducting paste 50 to become an interlayer connection material. The conducting paste 50 is one made by adding a solution of ethyl-cellulose resin 6*g* in terpineol 60*g*, which is an organic solvent, to tin particles 300*g* of average particle diameter 5 µm, specific surface area 0.5 m$^2$/g and silver particles 300*g* of average particle diameter 1 µm, specific surface area 1.2 m$^2$/g and kneading this into a paste with a mixer.

Here, the ethyl-cellulose resin is added to impart automorphism to the conducting paste 50, and an acrylic resin or the like may alternatively be used as the automorphism imparting agent.

After the conducting paste 50 is filled into the via holes 24 of the one-side pattern film 21 by printing with a screen printing machine using a metal mask, the terpineol is dried at 140 to 160° C. for about 30 minutes.

Before the conducting paste 50 is filled into the via holes 24, the parts of the interconnection patterns 22 facing the via holes 24 may be thinly etched or reduced. When this is done, via connections, which will be further discussed later, can be effected better.

Next, as shown in FIG. 3(*d*), multiple one-side pattern films 21 (in this example, three) are stacked, and a resin film 23 with no interconnection patterns 22 formed on it is further stacked on to the side where the interconnection patterns 22 of a one-side pattern film 21 are exposed. At this time, all of the stacked one-side pattern films 21 are stacked with their side on which the interconnection patterns 22 are provided as the upper side. As a result, on the opposite face to the face on which the resin film 23 is stacked, via holes 24 filled with the conducting paste 50 appear.

Figure 4:
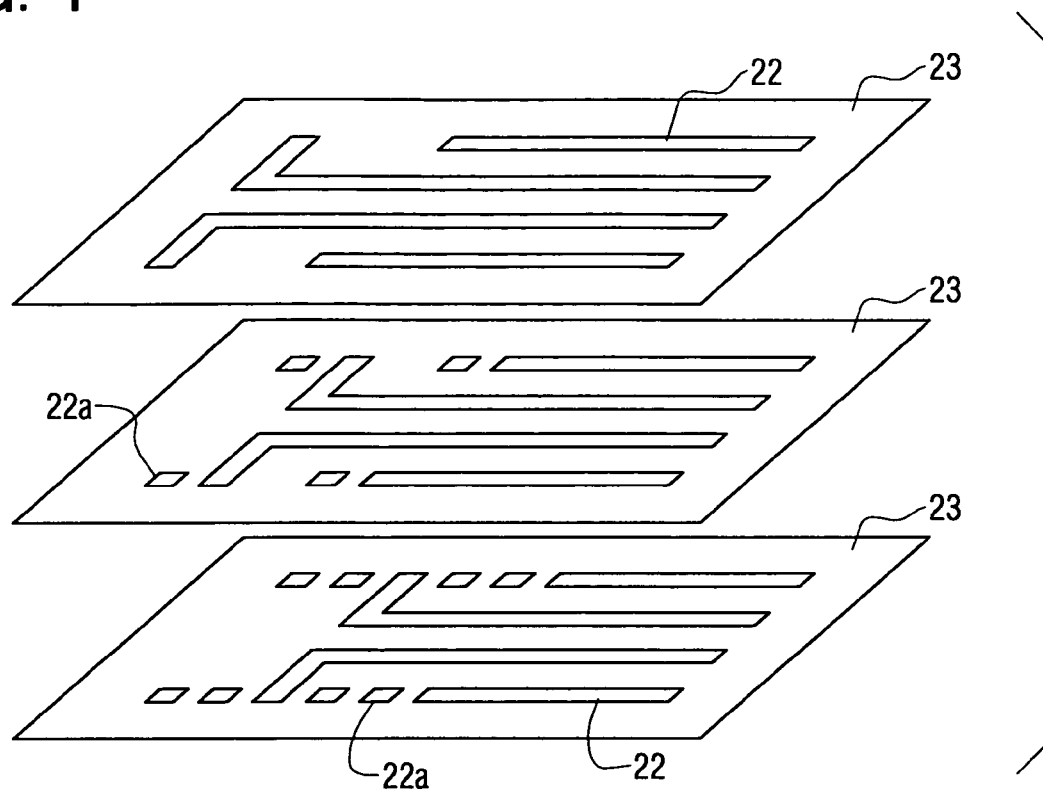
FIG. 4 is a perspective view showing shapes of interconnection patterns 22 formed on one-side pattern films 21 for constituting the FPC board 3.

Here, approximate shapes of interconnection patterns 22 formed on three stacked one-side pattern films 21 are shown in FIG. 4. As will be explained in detail later, in this example, via holes 24 and lands 32*a* for effecting electrical connection between a printed circuit board 2 and an FPC board 3 are arranged in two rows extending in the length direction of the FPC board 3. To this end, the interconnection patterns 22 and the lands 22*a* of the different layers are formed so that the interconnection patterns 22 of the one-side pattern film 21 positioned at the top in FIG. 4 are connected by the conducting paste 50 to lands 22*a* of the one-side pattern film 21 of the bottom layer.

When the one-side pattern films 21 and the resin film 23 have been stacked as shown in FIG. 3(*d*), they are heated and pressed from the upper and lower faces by a vacuum thermopressing machine not shown in the drawings. In this example, they are heated to a temperature of 300° C. to 350° C. and pressed for 40 to 60 minutes at a pressure of 1 to 10 MPa. As a result, as shown in FIG. 3(*e*), the one-side pattern films 21 and the resin films 23 soften and plastically deform, and bond to each other. Because the resin films 23 are all made of the same thermoplastic resin material, they easily thermally fuse and become an integrated insulating board. At this time, because the FPC board 3 is made by stacking one-side pattern films 21 and a resin film 23 each having the shape of a flat plate, as a whole it has the shape of a flat plate. After the heating and pressing, it is cooled to room temperature and the thermoplastic resin sets again.

Also, the conducting paste 50 in the via holes 24 bakes and integrates and becomes a conducting composition 51, and forms diffusion junctions with the adjacent interconnection patterns 22. By this means, interlayer connection between the adjacent interconnection patterns 22 is effected. By way of such steps, an FPC board 3 having a multiple layer structure in which insulating resin films 23 and interconnection patterns 22 are stacked alternately is obtained.

Here, the mechanism of the interlayer connection of the interconnection patterns 22 will be briefly explained. The conducting paste 50 filled into the via holes 24 and dried contains tin particles and silver particles in a mixed state. When this paste 50 is heated to 300 to 350° C., because the melting point of the tin particles is 232° C. and the melting point of the silver particles is 961° C., the tin particles melt and adhere to the silver particles so as to coat them.

When in this state the heating is continued, the melted tin starts to diffuse through the surfaces of the silver particles and forms an alloy of tin and silver (of melting point 480° C.). At this time, because a pressure of 1 to 10 MPa is being applied to the conducting paste 50, along with the formation of the tin and the silver into an alloy, inside the via holes 24 a conducting composition 51 consisting of alloy integrated by baking is formed.

When the conducting composition 51 is being formed inside the via holes 24, because this conducting composition 51 is being pressurized, it is pressure-welded to the faces of the interconnection patterns 22 forming the bottoms of the via holes 24. As a result, the tin component in the conducting composition 51 and the copper component of the copper foil constituting the interconnection patterns 22 solid-phase diffuse into each other, and a solid-phase diffusion layer is formed at the interface between the conducting composition 51 and the interconnection patterns 22 and electrically connects them.

Figure 5:
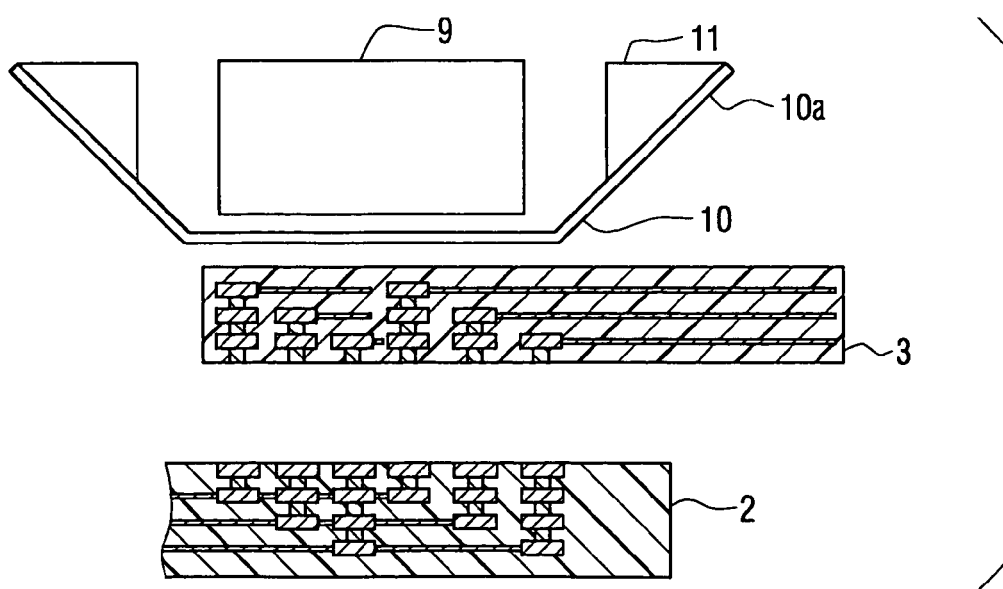
FIG. 5 is a view illustrating a step of connecting the printed circuit board 2 and the FPC board 3.

Next, a method for connecting the printed circuit board 2 and the FPC board 3 will be described, on the basis of FIG. 5 and FIG. 6.

Figure 6:
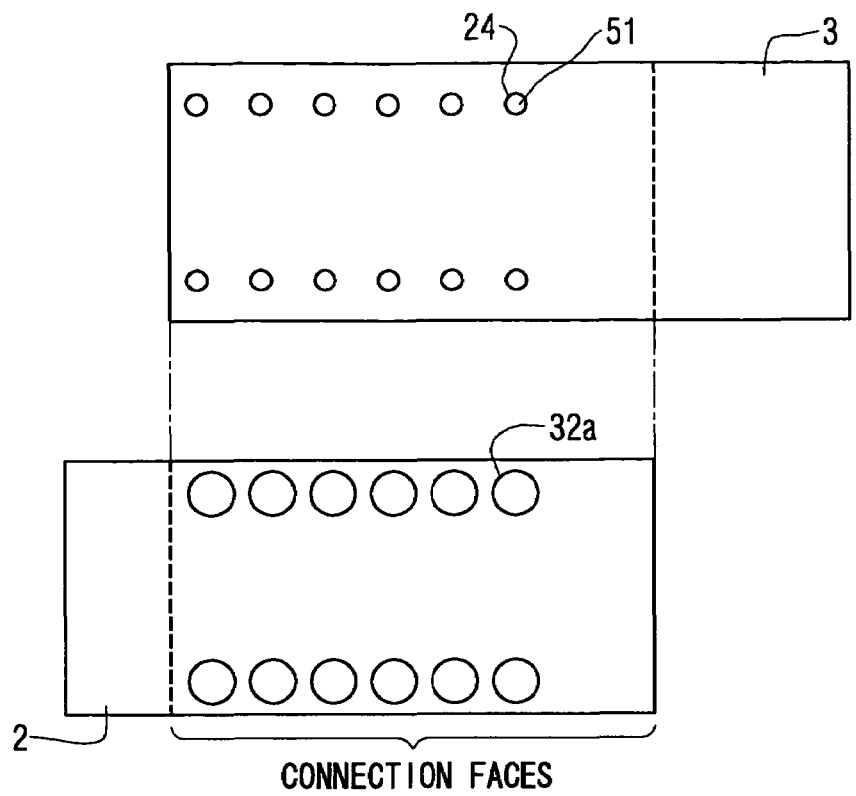
FIG. 6 is a view showing respective connection faces of the printed circuit board 2 and the FPC board 3.

FIG. 6 is a view showing the connection faces of the printed circuit board 2 and the FPC board 3. As shown in FIG. 6, multiple lands 32a are arranged in two rows on the upper face (connection face) of the printed circuit board 2. The connection of interconnections to these lands 32a is effected by interconnection patterns 32, lands 32a and conducting composition 51 formed in the inner layers of the printed circuit board 2. Accordingly, because it is not necessary to form interconnection patterns 32 on the connection face of the printed circuit board 2 and run interconnections to these, an ample area for forming the lands 32a can be provided. Incidentally, it is not necessary for connection to all of the lands 32a on the connection face to be effected by means of interconnection patterns 32 formed on inner layers, and if there is room to form interconnection patterns 32 on the connection face, interconnection patterns 32 connected to some of the lands 32a may be formed on the connection face.

On the connection face of the FPC board 3, on the other hand, via holes 24 are formed in positions corresponding to the lands 32a on the printed circuit board 2, and these via holes 24 are filled with the above-mentioned conducting composition 51.

Then, the FPC board 3 is superposed on and aligned with the printed circuit board 2. That is, the connection face of the printed circuit board 2 and the connection face of the FPC board 3 are aligned so that the locations of the conducting composition 51 of the FPC board 3 face the lands 32a formed on the connection face of the printed circuit board 2.

Before the connection face of the printed circuit board 2 and the connection face of the FPC board 3 are superposed, preferably at least one of the connection faces is irradiated with UV light (for example UV light of wavelength 185 nm) or a plasma, to roughen the connection face. By surface roughening the connection faces like this, it is possible to increase the bonding strength of when the thermoplastic resin of the FPC board 3 deforms and adheres to the resin of the connection face of the printed circuit board 2. That is, when a connection face is roughened, because minute irregularities are formed on its surface, its surface area is increased, and also an anchoring effect arises between the connection faces. And because irradiation with UV light or a plasma can also be expected to have an effect of removing extraneous matter from the connection face, this also contributes to improvement of the bonding strength.

When a liquid crystal polymer is used as the thermoplastic resin, as will be discussed later, irradiation with UV light is particularly effective in increasing the bonding strength. When a liquid crystal polymer is irradiated with UV light, the chemical structure of the liquid crystal polymer at the irradiated part is partially broken down, and functional groups such as hydroxyl groups (OH) and carboxyl groups (COOH) appear at the surface. Because such functional groups at the surface of the liquid crystal polymer combine chemically with the resin of the other circuit board to which it is being bonded, this adds to the effects mentioned above and increases the bonding strength still more.

Next, the connection site where the printed circuit board 2 and the FPC board 3 overlap is pressurized and heated with a thermocompression tool 9. The thermocompression tool 9 presses against the FPC board 3 by way of a SUS plate 10. The SUS plate 10 transmits heat and pressing force from the thermocompression tool 9 to the connection site (overlap region) between the printed circuit board 2 and the FPC board 3. Also, the SUS plate 10 has sloping parts 10a at its ends in the length direction of the FPC board 3, and these sloping parts 10a have the function of holding heat-sinking plates 11 made of a metal having good heat conductivity (for example copper).

The glass transition temperature of the thermoplastic resin constituting the FPC board 3 is 150° C. to 230° C., and the thermocompression tool 9 applies a pressure to the connection site of the two boards 2, 3 while heating them at a temperature above the glass transition temperature of that thermoplastic resin and a temperature at which the tin component diffuses from the conducting composition 51 into the lands 32a. For example, the heating temperature is 300° C. to 350° C., and the heating and pressurization are continued for 15 seconds to 25 seconds. In this example, a pulse heating type thermocompression tool 9 is used.

By this thermocompression bonding with the thermocompression tool 9, while metal diffusion junctions are formed between the conducting composition 51 and the lands 32a, the thermoplastic resin constituting the FPC board 1 is caused to soften and deform and become intimate with the connection face of the printed circuit board 2.

In this embodiment, when the thermoplastic resin constituting the FPC board 3 is caused to soften and deform with the thermocompression tool 9, the ends of the thermocompression tool 9 in the length direction of the FPC board 3 are cooled by the heat-sinking plates 11. Consequently, excessive deformation of the thermoplastic resin at the ends of the thermocompression tool 9 in the length direction of the FPC board 1 can be suppressed. That is, because the heat-sinking plates 11 are provided on the SUS plate 10 at the ends of the connection face of the FPC board 3, even while heat is being applied by the thermocompression tool 9, temperature increase of the resin of the FPC board 3 at these ends is suppressed, and the resin does not tend to flow. Consequently, even where the thermocompression tool 9 is pressed the thickness of the FPC board 3 does not become excessively thin, and the variation of the thickness of the FPC board 3 can be made gentle. Because of this, even when a bending stress acts on the FPC board 3, durability of the circuit board 1 with respect to that bending stress can be amply secured.

Figure 7:
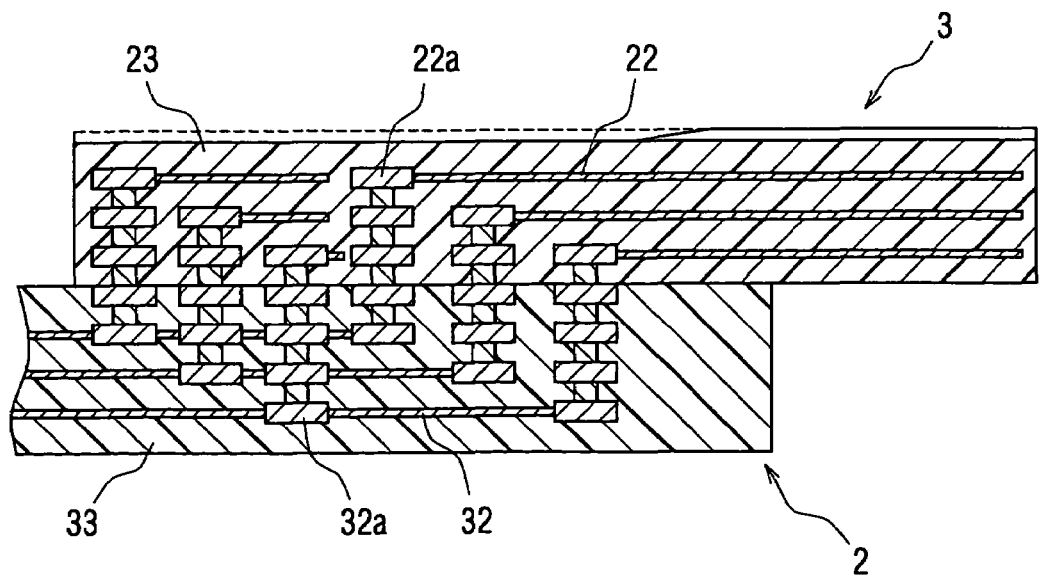
FIG. 7 is a sectional view showing deformation of the FPC board 3 caused by a thermocompression tool 9 in a region where the printed circuit board 2 and the FPC board 3 overlap.

An example of the state of the part of the FPC board 3 against which the thermocompression tool 9 has been pressed after the heating and pressing carried out with the thermocompression tool 9 is shown in FIG. 7. As shown in FIG. 7, as a trace of the heating and pressing carried out by the thermocompression tool 9, the thickness of the FPC board 3 at an application area is slightly thinner than the thickness at a non-application area. That is, because as a result of the influence of the heat-sinking effected by the heat-sinking plates 11 there is almost no deformation at the periphery of the application area, the deformation (thinning) at the application area is also kept small. As a result, at the boundary between the application area and the non-application area, the thickness of the FPC board 3 changes gently.

When the thermoplastic resin of the FPC board 3 is softened by means of a thermocompression tool 9, as described above, if the printed circuit board 2 also employs the thermoplastic resin as an insulating material, it is conceivable that the thermoplastic resin of the printed circuit board 2 serving as a mother board will also deform. However, because various package devices are mounted on the printed circuit board 2, considering insulativity and problems such as shorting and breaking of interconnections, it is preferable for deformation of the insulating material of the printed circuit board 2 to be suppressed.

This can be achieved by using as the thermoplastic resin constituting the resin films 23 of the FPC board 3 a thermoplastic resin material having a lower melting point than the thermoplastic resin constituting the insulating films 33 of the printed circuit board 2. For example, when the above-mentioned thermoplastic resin made of PEEK and PEI is used as the thermoplastic resin material of the FPC board 3, as the thermoplastic resin material of the printed circuit board 2, an II-type liquid crystal polymer of liquid crystal transition point 285° C. or an I-type liquid crystal polymer of liquid crystal transition point 335° C. can be used. And the printed circuit board 2 and the FPC board 3 can both be made with a liquid crystal polymer, and in this case a III-type liquid crystal polymer of liquid crystal transition point 210° C. could be added to the above-mentioned I-type and II-type liquid crystal polymers and a combination employed such that the liquid crystal transition point of the printed circuit board 2 is higher. Also, in the case of liquid crystal polymers, because the melting point varies with the molecular weight, for example an I-type LCP with a low molecular weight could be used as the material of the FPC board 3 and an I-type LCP with an ordinary molecular weight then used as the material of the printed circuit board 2.

Second Embodiment

Next, a second embodiment of the invention will be described. In this second embodiment, only the method of forming the FPC board 3 differs from the first embodiment described above. In the following, points differing from the first embodiment will be described.

In the first embodiment described above, as shown in FIG. 3(d), of the stacked one-side pattern films 21, via holes 24 are formed even in the one-side pattern film 21 of the lowest layer, which constitutes the connection face to be connected to the printed circuit board 2, and the conducting paste 50 is filled into those via holes 24 also. Then, by the stacked one-side pattern films 21 and a resin film 23 being heated and pressed, the films 21, 23 were bonded together to form the FPC board 3.

Figure 8:
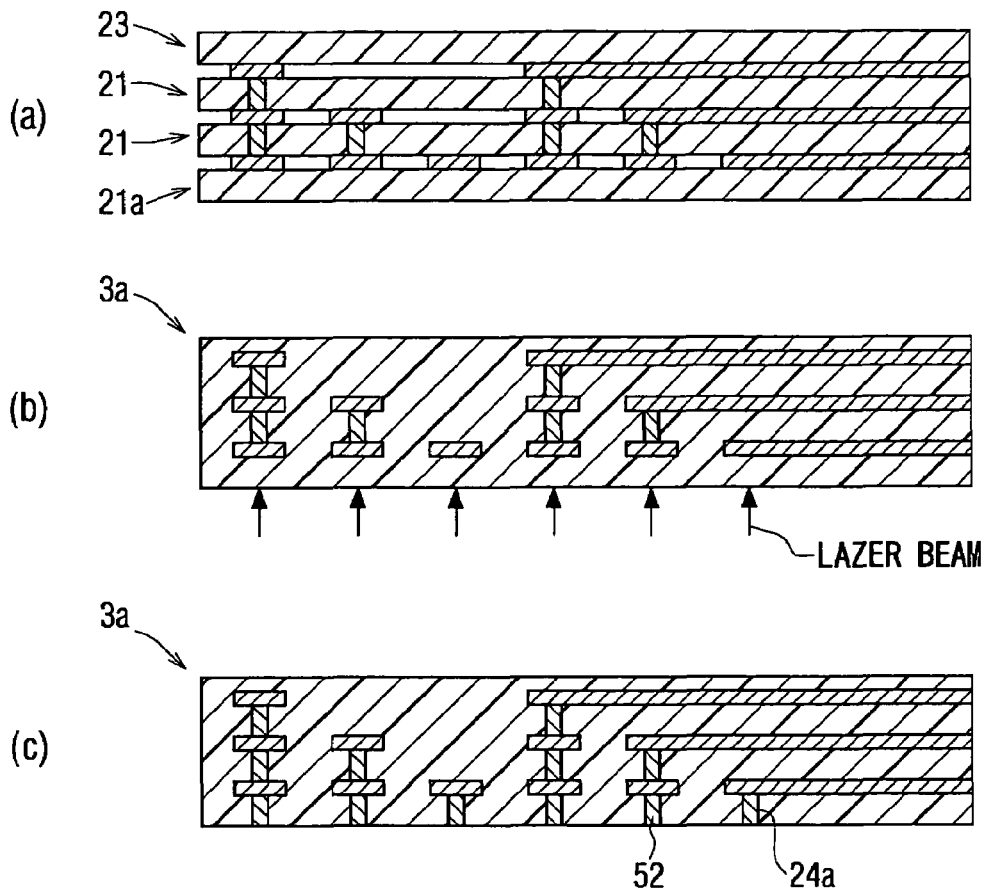
FIGS. 8(a) through (c) are step by step sectional views showing part of a process for manufacturing an FPC board 3 according to a second embodiment.

With respect to this, in the FPC board 3 forming method of this second embodiment, as shown in FIG. 8(a), films 21, 21a and 23 are stacked without via holes 24 being formed in the one-side pattern film 21a of the bottom layer, which constitutes the connection face to be connected to the printed circuit board 2. Then, as shown in FIG. 8(b), in the same way as in the first embodiment, the stacked films 21, 21a, 23 are heated and pressed from the upper and lower sides to form an FPC board 3a.

After the FPC board 3a is formed like this, a laser beam is irradiated, from the side on which is the connection face to be connected to the printed circuit board 2, at positions corresponding to lands 22a of the interconnection patterns 22 formed inside it. By holemaking effected by this laser beam irradiation, via holes 24a reaching the lands 22a are formed.

After that, as shown in FIG. 8(c), the via holes 24a thus made are filled with a connection material for effecting connection to the lands 32a of the printed circuit board 2. As the connection material, a tin-lead family, tin-silver family or tin-copper family solder, or a tin-lead family, tin-silver family or tin-copper family conducting paste formed by the same technique as in the first embodiment can be used. To fill the solder into the via holes 24a, a plating process may be carried out, or the solder may be made into a paste form and filled therein.

With the FPC board 3 forming method of this second embodiment, a connection material exposed at the connection face to be connected to the printed circuit board 2 can be provided after the formation of the FPC board 3. Consequently, there is the merit that any of various connection materials can be employed, without the heat and pressure of the FPC board 3 formation process needing to be taken into account.

Third Embodiment

Next, a third embodiment of the invention will be described. In this third embodiment, the structure of the FPC board 3 differs from that of the first embodiment described above. In the following, points differing from the first embodiment will be described.

In the first embodiment described above, via holes 24 were formed in the connection face of the FPC board 3 to be connected to the printed circuit board 2, and these were filled with the conducting composition 51.

With respect to this, in this third embodiment, lands 22a are formed on a connection face of a FPC 3b to be connected to a printed circuit board 2, and on these lands 22a a connection material for connecting them to lands 32a of the printed circuit board 2 are formed. The details of this will be described below using FIGS. 9(a) and (b).

Figure 9:
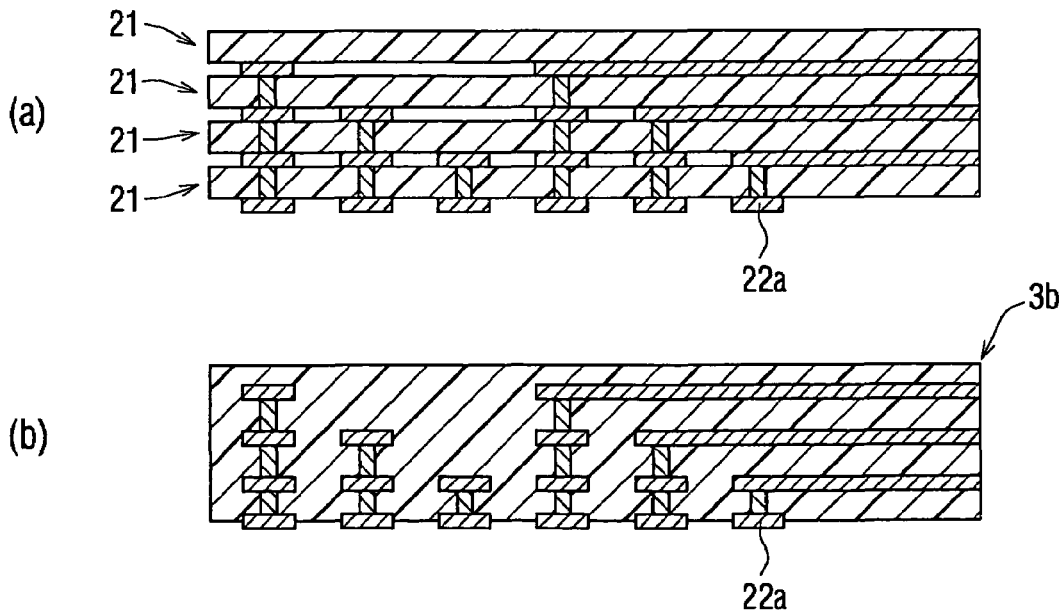
FIGS. 9(a) and (b) are step by step sectional views showing part of a process for manufacturing an FPC board 3 according to a third embodiment.

First, as shown in FIG. 9(a), in a film stacking step, a resin film 23 not having interconnection patterns formed on it is not used, and one-side pattern films 21 all having interconnection patterns 22 formed on them are used. In this case, all the one-side pattern films 21 are stacked in the same orientation, with the face on which the interconnection patterns 22 are formed made the lower face. Accordingly, in FIG. 9(a), in the stack of multiple one-side pattern films 21, interconnection patterns 22 (lands 22a) are exposed on its bottom face.

Next, in the same way as in the first embodiment, the stack of one-side pattern films 21 is heated and pressed from its upper and lower faces to form a FPC board 3b. At this time, as shown in FIG. 9(b), the lands 22a which are exposed on the bottom face of the FPC board 3b are at least partly embedded in the resin part, and thus firmly fixed to the FPC board 3b. After that, a tin-lead family, tin-silver family or tin-copper family solder is plated, or a paste-form solder is applied, to the surfaces of the exposed lands 22a. By this means, a connection material for connecting the lands 22a of the FPC board 3 and the lands 32a of the printed circuit board 2 is formed. This connection material may alternatively be formed on the lands 32a of the printed circuit board 2.

With this third embodiment also, the lands 32a of the printed circuit board 2 and the lands 22a of the FPC board 3 can be connected at multiple locations. Consequently, numerous connecting signal lines can be provided between the printed circuit board 2 and the FPC board 3 without widening the FPC board 3.

Although some preferred embodiments of the invention have been described above, the invention is not limited to these embodiments, and various changes are possible.

Figure 10:
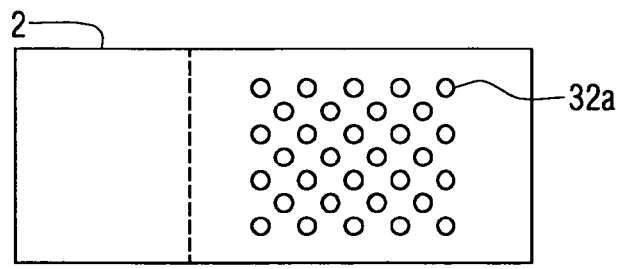
FIG. 10 is a plan view showing a variation of the layout of lands 32a on the connection face of the printed circuit board 2.
Figure 11:
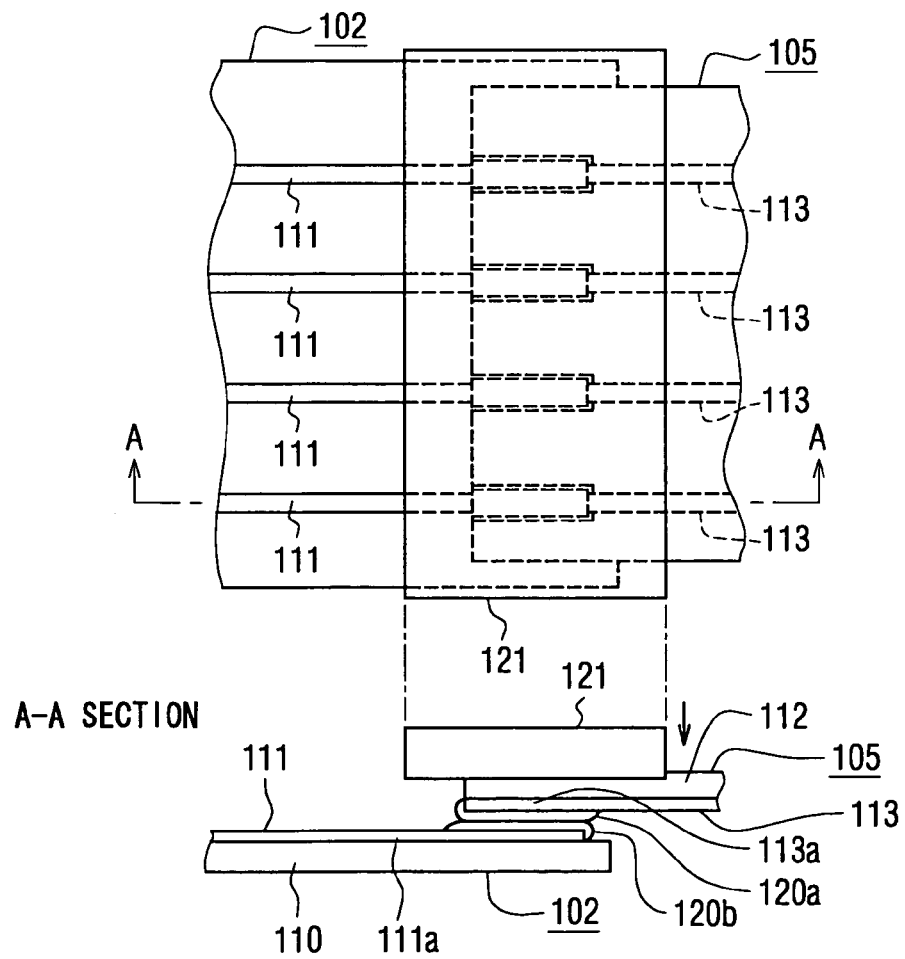
FIG. 11 is a view illustrating a printed circuit board connection structure of related art.

For example, in the first embodiment described above, the connection between the printed circuit board 2 and the FPC board 3 was effected by lands 32*a* and plugs of conducting composition 51 each arranged in two rows. However, alternatively an arrangement of the lands 32*a* and the plugs of conducting composition 51 other than a two row arrangement can be adopted, and as long as they are arranged in at least two dimensions the connection faces can be used effectively for the formation of the lands 32*a* and the plugs of conducting composition 51. For example, as shown in FIG. 10, the lands 32*a* and the plugs of conducting composition 51 may each be arranged on the respective connection face in a grid. In this case, because the whole area of the connection face can be utilized for the formation of the lands 32*a* and the plugs of conducting composition 51, the number of lands 32*a* and plugs of conducting composition 51 that can be formed can be greatly increased.

And whereas in the first embodiment described above a conducting composition 51 including tin and silver filled into the via holes 24 of the FPC board 3 was used as the connection material to connect to the lands 32*a*, alternatively, as described in the second and third embodiments, some other material may be formed in the via holes. For example, a low melting point metal material such as solder may be filled into the via holes 24 by plating, or coated onto the conducting composition 51. However, using tin and silver, which is a metal having a higher melting point than tin, is preferable, because when the two are alloyed to become the conducting composition 51, because its melting point is higher than the melting point of tin, even when a heating step such as reflowing is carried out afterward, it does not melt again, and high connection reliability is obtained.

And, as the insulating resin material of the FPC board 3, besides the above-mentioned mixture of PEEK and PEI, or liquid crystal polymers, either PEI or PEEK can be used alone. Also, as examples of other insulating resin materials of the FPC board 3, polyphenylenesulfide (PPS), polyethylenenaphthalate (PEN) or polyethyleneterephthalate (PET) may be used.

And, the shape of the lands on the interconnection patterns 22, 23 may be any of square lands, round lands, or irregular lands. However, because it is preferable from the point of view of securing connection reliability for them to have a greater diameter than the diameter of the via holes 24 (50 μm to 100 μm), their diameter is preferably made for example about 150 μm to 250 μm.

And, although in the embodiments described above the printed circuit board 2 and the FPC board 3 were connected with end parts thereof overlapping and the two boards extending in opposite directions, the end parts of the two boards may alternatively be connected with the two boards extending in the same direction, or for at least one of the boards not its end part but its central part may be connected.

The invention claimed is:

1. A circuit board having a flat plate shaped first board part and a flat plate shaped second board part disposed stacked on a partial region of this first board part, said circuit board characterized in that said first board part and said second board part each comprise a substrate formed in a flat plate shape, a plurality of interconnection patterns arranged inside said substrate so as to form a plurality of layers in its thickness direction, and a plurality of interlayer connection parts disposed inside said substrate for connecting interconnection patterns belonging to different layers, at least one of the substrate of said first board part and the substrate of said second board part comprises a thermoplastic resin substrate made only of a thermoplastic resin, said first board part and said second board part are joined at their respective stacked regions by the thermoplastic resin, a plurality of first interconnection patterns are disposed on said stacked region of said first board part, a plurality of second interconnection patterns are disposed on said stacked region of said second board part so as to form pairs with said plurality of first interconnection patterns, and between the pairs of said first interconnection patterns and said second interconnection patterns, interboard connection parts are formed from a connection material which at a temperature applied to melt the thermoplastic resin melts at least partially and electrically connects the first and second interconnection patterns together.

2. A circuit board according to claim 1, characterized in that a part of said second board part is stacked on said first board part.

3. A circuit board according to claim 1, characterized in that said second board part is more pliable than said first board part.

4. A circuit board according to claim 1, characterized in that the substrate of said first board part and the substrate of said second board part are each made of the thermoplastic resin.

5. A circuit board according to claim 4, characterized in that the substrate of said first board part and the substrate of said second board part are made of an identical thermoplastic resin.

6. A circuit board according to claim 4, characterized in that the thermoplastic resin of said first board part has a lower melting point than the thermoplastic resin constituting said second board part.

7. A circuit board according to claim 1, characterized in that of said first board part and said second board part, said interlayer connection parts of the board part having the thermoplastic resin substrate made only of the thermoplastic resin and said interboard connection parts are made from the same connection material, and the connection material constituting the interboard connection parts is connected to the first and second interconnection patterns by a metal diffusion junction.

8. A circuit board according to claim 7, characterized in that said connection material includes tin and silver as main components, the first and second interconnection patterns include copper, and the tin of the connection material and the copper of the first and second interconnection patterns are solid-phase diffused into each other to form interfaces therebetween.

9. A circuit board according to claim 7, characterized in that, of said first board part and said second board part, the interboard connection parts belong to the board part having a thermoplastic resin as its substrate.

10. A circuit board according to claim 1, characterized in that said first and second interconnection patterns are arranged so as to form at least two rows.

11. A circuit board according to claim 1, characterized in that said first board part and said second board part are joined using an adhesive character of the thermoplastic resin of the thermoplastic resin substrate.

12. A circuit board according to claim 1, wherein the thermoplastic resin substrate of the first board part functions as an insulator.

13. A circuit board according to claim 1, wherein the thermoplastic resin substrate of the second board part functions as an insulator.

14. A circuit board having a flat plate shaped first board part and a flat plate shaped second board part disposed stacked on a partial region of this first board part, said circuit board characterized in that said first board part and said second board part each comprise a substrate formed in a flat plate shape, a plurality of interconnection patterns arranged inside said substrate so as to form a plurality of layers in its thickness direction, and a plurality of interlayer connection parts disposed inside said substrate for connecting interconnection patterns belonging to different layers, at least one of the substrate of said first board part and the substrate of said second board part is made of a thermoplastic resin, said first board part and said second board part are joined at their respective stacked regions by the thermoplastic resin being melted and then rehardened, a plurality of first interconnection patterns are disposed on said stacked region of said first board part, a plurality of second interconnection patterns are disposed on said stacked region of said second board part so as to form pairs with said plurality of first interconnection patterns, between the pairs of said first interconnection patterns and said second interconnection patterns, interboard connection parts are formed from a connection material which at a temperature applied to melt the thermoplastic resin melts at least partially and electrically connects the first and second interconnection patterns together, and of said first board part and said second board part, the board part having a thermoplastic resin as its substrate has the stacked region and a non-stacked region which is not stacked on the other board part, and in the stacked region a trace resulting from a greater number of meltings and rehardenings than the non-stacked region is left.

15. A circuit board according to claim 14, characterized in that as said trace, a mark resulting from pressing said thermoplastic resin remains in said stacked region.

16. A circuit board connection structure for connecting a first circuit board in which a thermoplastic resin is used as an insulating material to a second circuit board serving as a mother board, wherein said first circuit board has a multilayer structure wherein insulating layers made only from a thermoplastic resin and interconnection layers are stacked alternately and to electrically connect adjacent interconnection layers together an interlayer connection material is disposed in said insulating layers, in an insulating layer being made only from the thermoplastic resin and constituting a connection face of said first circuit board to be connected to said second circuit board, via holes reaching the inner interconnection layers are formed, said via holes being filled with a connection material, said second circuit board has a multilayer structure wherein insulating layers and interconnection layers are stacked alternately and an interlayer connection material for electrically connecting adjacent interconnection layers together is disposed in said insulating layers, at least lands serving as connection terminals are formed on a connection face of said second circuit board, and inner interconnection layers are used for interconnecting said lands, said first circuit board is connected to said second circuit board by said connection material of the first circuit board being electrically connected to the lands of said second circuit board and the insulating layer constituting the connection face of said first circuit board being adhered to the connection face of said second circuit board by thermal welding, and wherein the insulating layers of said second circuit board are made from a thermoplastic resin, and the thermoplastic resin constituting the insulating layers of the first board comprises a thermoplastic resin material having a lower melting point than the thermoplastic resin constituting the insulating layers of said second circuit board.

17. A circuit board connection structure for connecting a first circuit board in which a thermoplastic resin is used as an insulating material to a second circuit board serving as a mother board, wherein said first circuit board has a multilayer structure wherein insulating layers made only from a thermoplastic resin and interconnection layers are stacked alternately and to electrically connect adjacent interconnection layers together an interlayer connection material is disposed in said insulating layers, in an insulating layer being made only from the thermoplastic resin and constituting a connection face of said first circuit board to be connected to said second circuit board, via holes reaching the inner interconnection layers are formed, said via holes being filled with a connection material, said second circuit board has a multilayer structure wherein insulating layers and interconnection layers are stacked alternately and an interlayer connection material for electrically connecting adjacent interconnection layers together is disposed in said insulating layers, at least lands serving as connection terminals are formed on a connection face of said second circuit board, and inner interconnection layers are used for interconnecting said lands, said first circuit board is connected to said second circuit board by said connection material of the first circuit board being electrically connected to the lands of said second circuit board and the insulating layer constituting the connection face of said first circuit board being adhered to the connection face of said second circuit board by thermal welding, and said connection material includes at least a tin component and a metal component with a higher melting point than the tin component, and is electrically connected to the lands of said second circuit board by the tin component diffusing into the lands.

\* \* \* \* \*

UNITED STATES PATENT AND TRADEMARK OFFICE
CERTIFICATE OF CORRECTION

PATENT NO.        : 7,417,195 B2                                              Page 1 of 1
APPLICATION NO.   : 10/769763
DATED             : August 26, 2008
INVENTOR(S)       : Totani et al.

It is certified that error appears in the above-identified patent and that said Letters Patent is hereby corrected as shown below:

Title Page

Correct the International Filing Date (item 63) of the original Letters Patent to read as:

(63) Continuation of application No. PCT/JP03/09963, filed on August 5, 2003.

Signed and Sealed this

Tenth Day of November, 2009

David J. Kappos
*Director of the United States Patent and Trademark Office*